United States Patent
Kim et al.

(10) Patent No.: US 7,754,577 B2
(45) Date of Patent: Jul. 13, 2010

(54) METHOD FOR FABRICATING CAPACITOR

(75) Inventors: Jin-Hyock Kim, Ichon-shi (KR); Seung-Jin Yeom, Ichon-shi (KR); Ki-Seon Park, Ichon-shi (KR); Han-Sang Song, Ichon-shi (KR); Deok-Sin Kil, Ichon-shi (KR); Jae-Sung Roh, Ichon-shi (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 941 days.

(21) Appl. No.: 11/452,407

(22) Filed: Jun. 14, 2006

(65) Prior Publication Data

US 2007/0099375 A1  May 3, 2007

(30) Foreign Application Priority Data

Nov. 3, 2005  (KR) .................... 10-2005-0104846

(51) Int. Cl.
*H01L 21/331* (2006.01)
(52) U.S. Cl. .............. 438/399; 438/396; 438/652; 438/656; 257/E21.011
(58) Field of Classification Search ............. 438/396, 438/399, 652, 656
See application file for complete search history.

(56) References Cited

U.S. PATENT DOCUMENTS

| 6,753,618 | B2 * | 6/2004 | Basceri et al. ............... 257/296 |
| 2003/0003649 | A1 * | 1/2003 | Park et al. .................... 438/239 |
| 2004/0224475 | A1 * | 11/2004 | Lee et al. ..................... 438/399 |
| 2006/0211228 | A1 * | 9/2006 | Matsuda ...................... 438/575 |
| 2006/0270177 | A1 * | 11/2006 | Park et al. .................... 438/386 |

FOREIGN PATENT DOCUMENTS

| KP | 2002-0028329 | 4/2002 |
| KP | 10-0414156 | 12/2003 |
| KP | 10-0522427 | 10/2005 |
| KP | 10-0587686 | 6/2006 |

* cited by examiner

*Primary Examiner*—Zandra Smith
*Assistant Examiner*—Christy L Novacek
(74) *Attorney, Agent, or Firm*—IP & T Law Firm PLC

(57) ABSTRACT

A method for fabricating a capacitor includes: forming a storage node contact plug over a substrate; forming an insulation layer having an opening exposing a surface of the storage node contact plug over the storage contact plug; forming a conductive layer for a storage node over the insulation layer and the exposed surface of the storage node contact plug through two steps performed at different temperatures; performing an isolation process to isolate parts of the conductive layer; and sequentially forming a dielectric layer and a plate electrode over the isolated conductive layer.

8 Claims, 7 Drawing Sheets

METHOD FOR FABRICATING CAPACITOR

RELATED APPLICATION

The present application is based upon and claims the benefit of priority to Korean patent application No. KR 2005-0104846, filed in the Korean Patent Office on Nov. 3, 2005, the entire contents of which are incorporated herein by reference.

TECHNICAL FIELD

The present invention relates to a method for fabricating a semiconductor device; and more particularly, to a method for fabricating a capacitor to improve a step coverage property of a storage node.

DESCRIPTION OF RELATED ARTS

As the scale of integration of dynamic random access memory (DRAM) devices has been recently increasing, it has been hard to secure a required dielectric capacitance. To secure the required dielectric capacitance, a thickness of a dielectric thin film should be reduced or a material with a higher dielectric constant should be used.

In DRAM devices having a smallest feature size equal to or less than 80 nm, a technology for forming a stack layer of hafnium oxide ($HfO_2$) and aluminum oxide ($Al_2O_3$) has been developed to secure both a minimum leakage current and a sufficient dielectric capacitance. However, it is difficult to obtain an equivalent oxide thickness equal to or less than 12 Å with this stack structure.

A concave type dielectric structure with the stack layer has reached a limit in securing a sufficient dielectric capacitance. To alleviate the shortcomings of a concave type dielectric structure, a cylinder-type structure may be used to secure the capacitor size.

However, a cylinder-type structure using a storage node formed from titanium nitride (TiN) has an equivalent oxide thickness of the dielectric layer as low as only approximately 11 Å. In devices with a smallest feature size equal to and less than 60 nm, an equivalent oxide thickness of the dielectric layer should be equal to or less than 10 Å to secure the dielectric capacitance.

Hence, the introduction of a metal electrode selected from a group consisting of ruthenium (Ru), praseodymium (Pr), and iridium (Ir) is required.

FIG. 1 is a cross-sectional view illustrating a typical method for fabricating a capacitor.

An inter-layer insulation layer 12 is formed over a substrate 11. Afterwards, a storage node contact plug 13 is formed in the inter-layer insulation layer 12 and in contact with a predetermined portion of the substrate 11. The storage node contact plug 13 may comprise polysilicon. Before the formation of the storage node contact plug 13, device isolation, word lines, and bit lines may be formed.

An etch stop layer 14 and a storage node oxide layer 15 are stacked over an upper portion of the inter-layer insulation layer 12 and the storage node contact plug 13.

The storage node oxide layer 15 and the etch stop layer 14 are sequentially etched, thereby forming a storage node hole 16 exposing an upper portion of the storage node contact plug 13. A storage node 17 is formed over the storage node oxide layer 15 and on sidewalls of the storage node hole 16, and are in contact with the exposed portion fo the storage node contact plug 13.

However, in case of using a metal such as Ru as a storage node, the typical method requires high layer density to avoid agglomeration. In addition, step coverage should be more than 80%.

If Ru is deposited as a metal storage node by using a typical chemical vapor deposition (CVD) method, the deposited thin Ru film may contain impurities such as carbon (C), hydrogen (H), and oxygen (O). CVD Ru also has a low density of approximately 7 $g/cm^3$, in contrast with a density of bulk Ru of approximately 12.2 $g/cm^3$, and a density of PVD Ru of approximately 11.9 $g/cm^3$. The impurities and low density of the deposited Ru may increase agglomeration, and lead to an unstable capacitance. As for the step coverage, in the devices with a smallest feature size equal to or less than 60 nm, it is difficult to obtain a critical dimension (CD) of a contact for forming the storage node equal to or less than 100 nm and an aspect ratio of 20 to 1.

An ALD method may be applied to alleviate these problems. However, through the ALD process performed at a temperature of approximately 300° C., a storage node is currently formed over a storage node oxide layer. A Ru thin film formed over the storage node oxide layer through an ALD process is generally not uniform because of a low nucleus generation density. Instead, the Ru thin film is formed in a discontinuous island type.

Accordingly, the ALD process requires a long incubation time, which reduces a throughput. It is therefore difficult to form an electrode with a thickness equal to or less than approximately 300 Å in a storage node with a high aspect ratio, and a uniform step coverage property cannot be obtained.

SUMMARY

The present invention provides a method for fabricating a capacitor suitable for reducing an incubation time during a formation of a storage node and improving a step coverage property.

Consistent with the present invention, there is provided a method for fabricating a capacitor, including: forming a storage node contact plug over a substrate; forming an insulation layer having an opening exposing a surface of the storage node contact plug over the storage node contact plug; forming a conductive layer for a storage node over the insulation layer and the exposed surface of the storage node contact plug through two steps performed at different temperatures; performing an isolation process to isolate the conductive layer for the storage node; and sequentially forming a dielectric layer and a plate electrode over the isolated conductive layer for the storage node.

Consistent with the present invention, there is also provided a method for fabricating a capacitor, including: forming a storage node contact plug over a substrate; forming an insulation layer having an opening exposing a surface of the storage node contact plug over the storage node contact plug; forming a catalytic layer over the insulation layer including the opening; forming a conductive layer for a storage node over the catalytic layer; performing an isolation process to isolate parts of the conductive layer; and sequentially forming a dielectric layer and a plate electrode over the isolated parts of the conductive layer.

Consistent with further aspect of the present invention, there is provided a method for fabricating a capacitor, including: forming a storage node contact plug over a substrate; forming an insulation layer having an opening exposing a surface of the storage node contact plug over the storage node contact plug; absorbing a catalytic gas over a surface of the insulation layer having the opening; forming a conductive layer for a storage node over the surface of the insulation layer; performing an isolation process to isolate parts of the conductive layer; and sequentially forming a dielectric layer and a plate electrode over the isolated parts of the conductive layer.

Additional features and advantages of the invention will be set forth in part in the description which follows, and in part will be apparent from that description, or may be learned by practice of the invention. The features and advantages of the invention will be realized and attained by means of the elements and combinations particularly pointed out in the appended claims.

It is to be understood that both the foregoing general description and the following detailed description are exemplary and explanatory and are intended to provide further explanation of the invention as claimed.

BRIEF DESCRIPTION OF THE DRAWINGS

The above and other features of the present invention will become better understood with respect to the following description of the preferred embodiments given in conjunction with the accompanying drawings, in which.

DETAILED DESCRIPTION

Hereinafter, detailed descriptions on certain embodiments of the present invention will be provided with reference to the accompanying drawings.

FIGS. 2A to 2D are cross-sectional views illustrating a method for fabricating a capacitor consistent with a first embodiment of the present invention.

Figure 1:
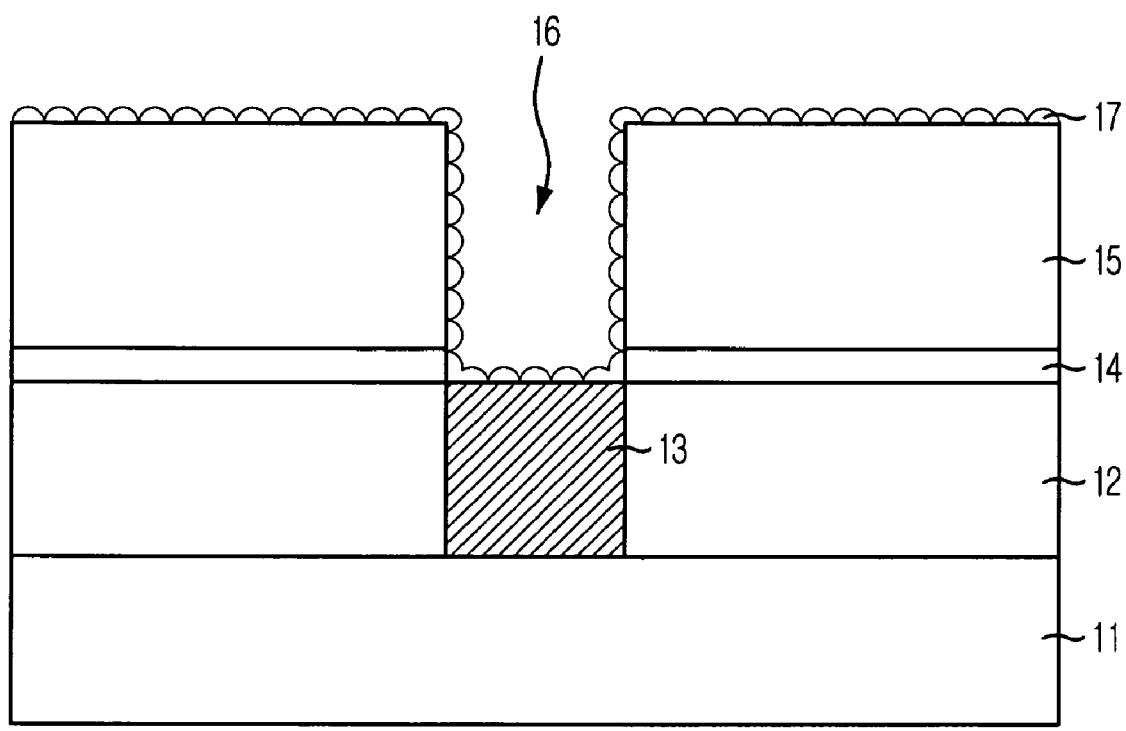
FIG. 1 is a cross-sectional view illustrating a typical method for fabricating a capacitor.
Figure 2A:
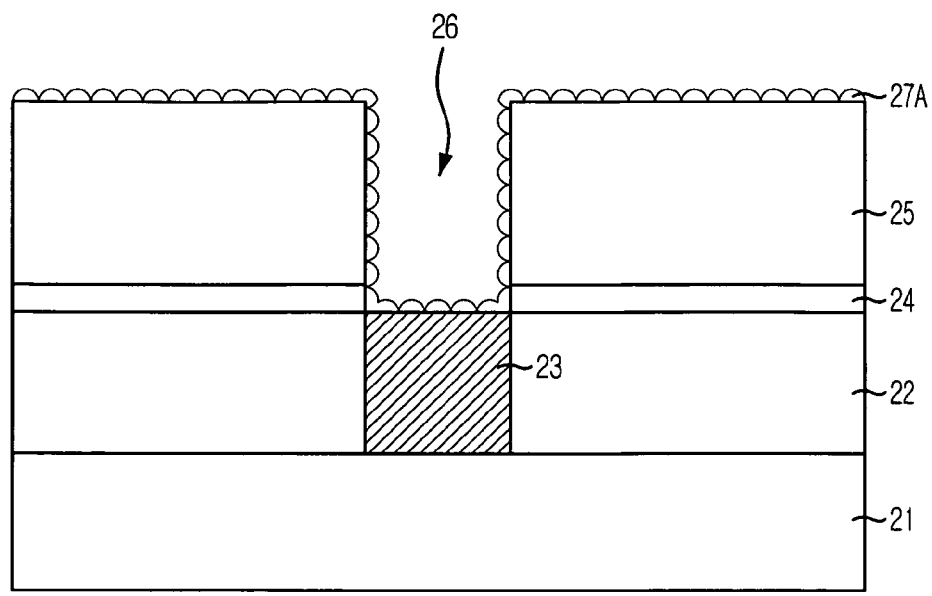
FIGS. 2A to 2D are cross-sectional views illustrating a method for fabricating a capacitor consistent with a first embodiment of the present invention.

Referring to FIG. 2A, an inter-layer insulation layer 22 is formed over a substrate 21 and afterwards, a storage node contact plug 23 is formed in the inter-layer insulation layer 22 and is in contact with a predetermined portion of the substrate 21. Although not illustrated, device isolation, word lines, and bit lines of a dynamic random access memory (DRAM) may be formed before the formation of the inter-layer insulation layer 22 and the storage node contact plug 23.

The storage node contact plug 23 comprises polysilicon plug or tungsten plug. If the storage node contact plug 23 comprises polysilicon, the storage node contact plug may be subjected to an etch-back process and recessed to a predetermined thickness and then, a titanium silicide (TiSi) layer (not shown) for forming an ohmic contact is formed.

An etch stop layer 24 and a storage node oxide layer 25 are staked over an upper portion of the inter-layer insulation layer 22 and the storage node contact plug 23. Herein, the storage node oxide layer 25 is an oxide layer to provide a hole in which a storage node with a cylinder structure will be formed, and the etch stop layer 24 is an etch barrier for preventing a lower structure from being etched during etching the storage node oxide layer 25.

The storage node oxide layer 25 and the etch stop layer 24 are sequentially etched, thereby forming a storage node hole 26 exposing an upper portion of the storage node contact plug 23.

A conductive layer for forming a storage node (or a metal layer) is formed through two steps over an entire surface of the storage node oxide layer 25 including the storage node hole 26.

In the first step, an atomic layer deposition (ALD) is performed at a temperature ranging from approximately 100° C. to approximately 250° C., thereby forming a storage node lower layer 27A in a thickness ranging from approximately 10 Å to approximately 50 Å over an entire surface of the storage node oxide layer 25 including the storage node hole 26.

The storage node lower layer 27A is deposited in atomic layers. Compared to the typical ALD method performed at a temperature of approximately 300°, the first step for forming the conductive layer consistent with the first embodiment of the present invention has a shorter incubation time, although a deposition rate per cycle is lower. Thus, it is possible to form a uniform storage node on a bottom portion of the storage node hole 26 only with several tens of cycles. Furthermore, it is also possible to prevent an oxidation of titanium or tungsten plug.

Accordingly, since the storage node lower layer 27A can be deposited with a uniform thickness up to the bottom portion of the storage node hole 26, degradation in a step coverage property due to an incubation time or a reduction in a throughput can be prevented.

The ALD is performed for approximately one cycle to approximately hundred cycles, and a deposition time of the storage node lower layer 27A can be reduced as much as the number of cycles is reduced.

Figure 2B:
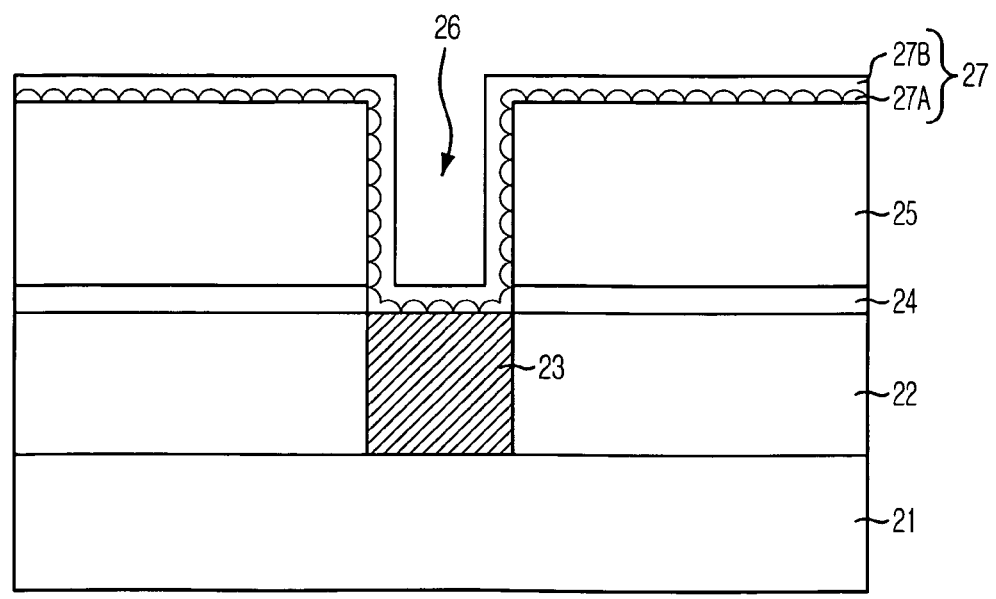

Referring to FIG. 2B, in the second step, a storage node main layer 27B is deposited in a thickness ranging from approximately 50 Å to approximately 150 Å at a temperature of approximately 300° C., and may comprise the same material as the storage node lower layer 27A. At this time, an ALD method or a combination of the ALD method and a chemical vapor deposition (CVD) method is used.

A unit cycle of the ALD method includes supplying a source gas, purging, supplying a reaction gas, and purging, and the unit cycle is repeated a number of times.

If a combination of the ALD method and the CVD method is performed, a source gas and a reaction gas are simultaneously supplied and thus, a CVD reaction takes place for a short time. Then, purging is performed and afterwards, an annealing is performed, while the reaction gas is provided.

Additionally, a plasma treatment can be performed while the reaction gas is provided. The reaction gas provided during the plasma treatment may comprise a gas selected from a group consisting of oxygen ($O_2$), ammonia ($NH_3$), dyhydrogen oxide ($H_2O$), hydrazine ($N_2H_4$), $Me_2N_2H_2$, hydrogen ($H_2$), and a combination thereof. The plasma treatment is performed using a plasma power ranging from approximately 10 W to approximately 2,000 W at a temperature ranging from approximately 200° C. to approximately 500° C.

Furthermore, a cyclic CVD may be performed without purging. A CVD reaction may occur at the last stage of each cycle of the ALD method. Thus, a reduction in a period of the unit cycle and an improvement in a deposition rate of a thin film due to the CVD effect can be expected.

While the reaction gas is continuously supplied and the source gas is discontinuously supplied, the deposition takes place using the CVD method when the source gas is supplied.

In the above described method, when the reaction gas is supplied, plasma can be used. Compared to a typical ALD method or a typical plasma enhanced atomic layer deposition (PEALD) method, a period of the unit cycle is reduced and a CVD deposition periodically takes place, and thus, a fast deposition rate of the thin film can be obtained.

Because there is a step of removing a reaction material in the unit cycle, a property of the thin film is better as compared to a pure CVD thin film.

After the storage node main layer 27B is deposited, a plasma treatment can be additionally performed in every unit cycle to improve a property of the thin film as the plasma treatment is performed after performing the ALD method.

Thus, a conductive layer 27 including the storage node lower layer 27A and the storage node main layer 27B is formed in a thickness ranging from approximately 100 Å to approximately 200 Å. The conductive layer 27 comprises a material selected from a group consisting of ruthenium (Ru), platinum (Pt), iridium (Ir), rhodium (Rh), palladium (Pd), hafnium (Hf), titanium (Ti), tungsten (W), tantalum (Ta), a nitrided film thereof, and a conductive oxide.

Figure 2C:
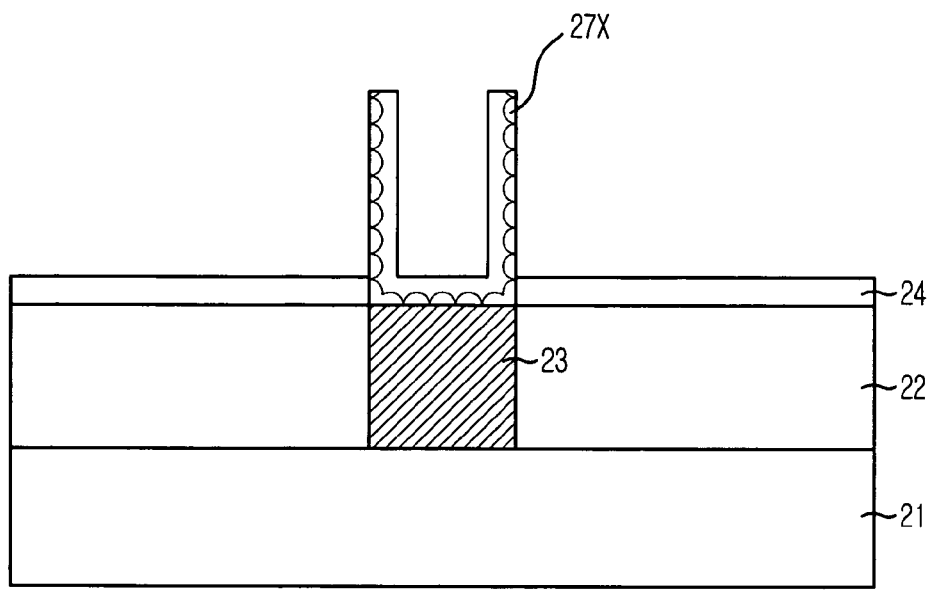

Referring to FIG. 2C, a storage node isolation process is performed to remove portions of the conductive layer 27 outside the storage node hole 26. As a result, a portion of the conductive layer 27, which has a cylinder-type structure and is referred to as remaining conductive layer 27X, remains only inside the storage node hole 26.

The storage node isolation process may comprise a chemical mechanical polishing (CMP) process or an etch-back process. During the CMP process or the etch-back process, there is a possibility of impurities such as an etched particle or an abrasive being attached to the inside of the remaining conductive layer 27X with the cylinder-type structure. To avoid such attachment of impurities, the inside of the storage node hole 26 is filled with a photoresist layer (not shown) with a good step coverage property before the etch-back process is performed. By the etch-back process, the storage node oxide layer 25 is exposed. Then, the photoresist layer is removed by ashing.

The storage node oxide layer 25 is removed by a full dip-out process, thereby exposing an inner wall and an external wall of the remaining conductive layer 27X. During the full dip-out process, the storage node oxide layer 25 may be etched by a hydrogen fluoride (HF) solution. The etch stop layer 24 beneath the storage node oxide layer 25 comprises silicon nitride, which has a lower etch rate than the storage node oxide layer 25. Therefore, the full dip-out process effectively stops at the etch stop layer 24.

Figure 2D:
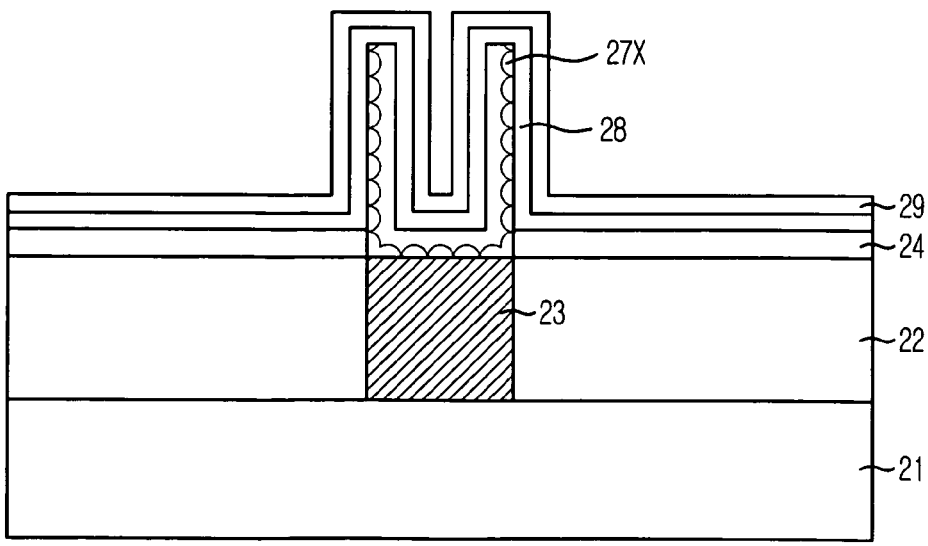

Referring to FIG. 2D, a dielectric layer 28 and a plate electrode 29 are sequentially formed over the remaining conductive layer 27X. The dielectric layer 28 includes a material selected from a group consisting of hafnium oxide ($HfO_2$), aluminum oxide ($Al_2O_3$), zirconium oxide ($ZrO_2$), lanthanum oxide ($La_2O_3$), tantalum oxide ($Ta_2O_5$), titanium oxide ($TiO_2$), BST($BaSrTiO_3$), strontium titanate ($SrTiO_3$), lead zirconate titanate (PZT), BLT, SPT, $Bi_2Ti_2O_7$, and a combination thereof. Exemplary combinations of the above mentioned materials for the dielectric layer 28 are $HfO_2/Al_2O_3$ and $HfO_2/Al_2O_3/HfO_2$. In addition, the dielectric layer 28 may comprise a mixed layer, e.g., $Hf_xAl_yO_z$ simultaneously including Hf and Al. The mixed layer may be formed through a method selected from a group consisting of a sputtering method, a CVD method such as plasma enhanced CVD (PECVD), and an ALD method. In case that a multi-layered dielectric structure is formed as the dielectric layer 28 by the ALD method, a unit cycle of the ALD method may comprise providing sources in a sequence of [($Hf/N_2/O_3/N_2$)m($Al/N_2/O_3/N_2$)n]. Herein, m and n are less than approximately 10. When a PECVD method is performed to form the dielectric layer 28, oxygen source may be provided in the form of a plasma of $O_2$, in contrast with supplying $O_3$ in the aforementioned ALD unit cycle.

After the dielectric layer 28 is deposited, a post-treatment is performed using $O_2$, $O_3$, or $O_2$ plasma at a temperature ranging from approximately 200° C. to approximately 500° C.

A silicon layer doped with arsenic (As) or phosphorous (P) or a titanium layer may be formed over the dielectric layer 28 as a plate electrode 29.

FIGS. 3A to 3D are cross-sectional views illustrating a method for fabricating a capacitor consistent with a second embodiment of the present invention.

Figure 3A:
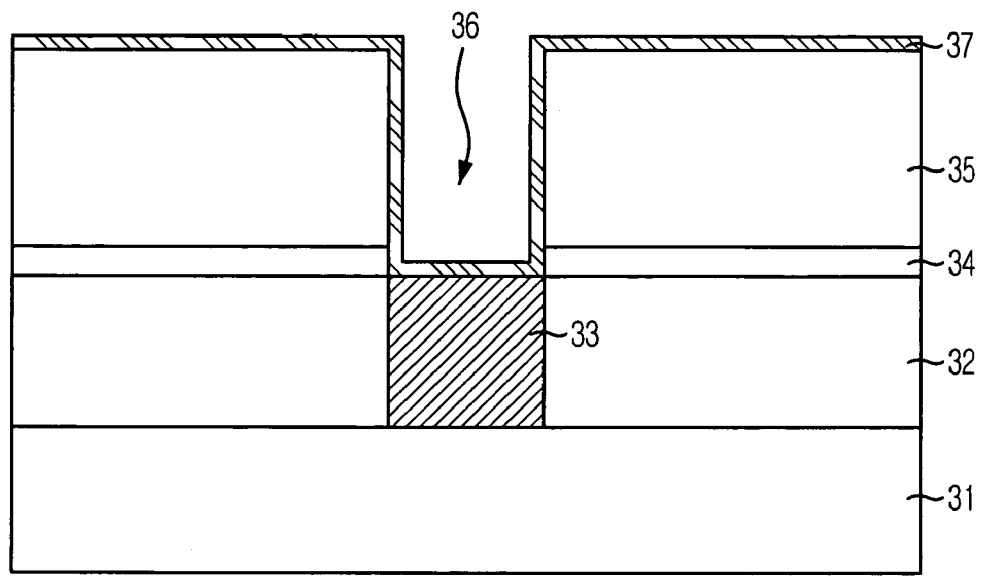
FIGS. 3A to 3D are cross-sectional views illustrating a method for fabricating a capacitor consistent with a second embodiment of the present invention.

Referring to FIG. 3A, an inter-layer insulation layer 32 is formed over a substrate 31 and afterwards, a storage node contact plug 33 is formed in the inter-layer insulation layer 32 and is in contact with a predetermined portion of the substrate 31. Although not illustrated, device isolation, word lines, and bit lines of a dynamic random access memory (DRAM) may be formed before the formation of the inter-layer insulation layer 32 and the storage node contact plug 33.

The storage node contact plug 33 comprises polysilicon plug or tungsten plug. If the storage node contact plug 33 comprises polysilicon, the storage node contact plug 33 may be subjected to an etch-back process and recessed to a predetermined thickness and then, a titanium silicide layer (not shown) for forming an ohmic contact is formed.

An etch stop layer 34 and a storage node oxide layer 35 are stacked over an upper portion of the inter-layer insulation layer 32 and the storage node contact plug 33. Herein, the storage node oxide layer 35 is an oxide layer to provide a hole in which a storage node with a cylinder-type structure will be formed, and the etch stop layer 34 is an etch barrier layer to prevent a lower structure from being etched during etching the storage node oxide layer 35.

The storage node oxide layer 35 and the etch stop layer 34 are sequentially etched, thereby forming a storage node contact hole 36 exposing the upper portion of the storage node contact plug 33.

A storage node is formed over an entire surface of the storage node oxide layer 35 including the storage node hole 36 through two steps.

In the first step, a catalytic layer 37 is deposited over an entire surface of the storage node oxide layer 35 including the storage node hole 36 to increase a nucleus generation density of a storage node. The catalytic layer 37 is formed in a thickness ranging from approximately 10 Å to approximately 50 Å. The catalytic layer is formed by using a method selected from an ALD method, a plasma enhanced atomic layer deposition (PEALD) method, a chemical vapor deposition (CVD) method, and a plasma enhanced atomic layer deposition (PECVD) method.

The catalytic layer 37 includes a material selected from a group consisting of palladium (Pd), a tungsten nitride (WN) layer, and tungsten nitride carbon (WNC).

If a storage node is formed in a subsequent process after the catalytic layer 37 is deposited over a surface of the storage node oxide layer 35 including the storage node hole 36, it is possible to minimize an incubation time of a storage node over the storage node oxide layer 35 since a nucleus generation density of the storage node is high.

Accordingly, a storage node with a uniform thickness can be deposited on a bottom portion of the storage node hole 36 and thus, degradation in a step coverage property due to an incubation time or a reduction in a throughput can be prevented.

Figure 3B:
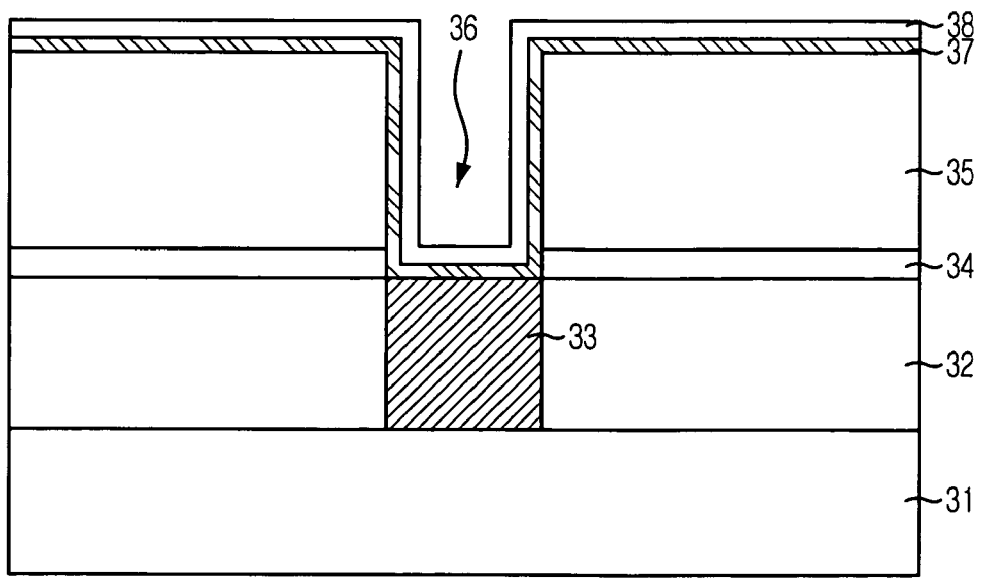

Referring to FIG. 3B, a conductive layer 38 for a storage node is deposited over the catalytic layer 37 at the second step. The conductive layer 38 may be formed by an ALD method or a combination of ALD method and CVD method.

In more detail, a unit cycle of the ALD method includes supplying a source gas, purging, supplying a reaction gas, and purging. The unit cycle is repeated for a number of times.

If a combination of the ALD method and the CVD method is performed, a source gas and a reaction gas are simultaneously supplied, and thus, a CVD reaction takes place for a short time. Then, the purging is performed, and afterwards, an annealing is performed, while the reaction gas is provided.

Additionally, a plasma treatment can be performed while the reaction gas is provided. The reaction gas provided during the plasma treatment may comprise a gas selected from a group consisting of oxygen ($O_2$), ammonia ($NH_3$), dyhydrogen oxide ($H_2O$), hydrazine ($N_2H_4$), $Me_2N_2H_2$, hydrogen ($H_2$), and a combination thereof. The plasma treatment is performed using a plasma power ranging from approximately 10 W to approximately 2,000 W at a temperature ranging from approximately 200° C. to approximately 500° C.

Furthermore, a cyclic CVD may be performed without purging. A CVD reaction may occur at the last stage of each cycle of the ALD method. Thus, a reduction in a period of the unit cycle and an improvement in a deposition rate of a thin film due to the CVD effect can be expected.

While the reaction gas is continuously supplied and the source gas is discontinuously supplied, the deposition takes place using the CVD method when the source gas is supplied.

In the above described method, when the reaction gas is supplied, plasma can be used. Compared to a typical ALD method or a typical plasma enhanced atomic layer deposition (PEALD) method, a period of the unit cycle is reduced and a CVD deposition is periodically takes place, and thus, a fast deposition rate of the thin film can be obtained.

Because there is a step of removing a reaction material in the unit cycle, a property of the thin film is better as compared to a pure CVD thin film.

After the conductive layer 38 is deposited, a plasma treatment can be additionally performed in every unit cycle to improve a property of the thin film as the plasma treatment is performed after performing the ALD method.

Consistent with the second embodiment of the present invention, the conductive layer 38 is formed in a thickness ranging from approximately 100 Å to approximately 200 Å. The conductive layer 38 comprises a material selected from the group consisting of ruthenium (Ru), platinum (Pt), iridium (Ir), rhodium (Rh), palladium (Pd), hafnium (Hf), titanium (Ti), tungsten (W), tantalum (Ta), a nitrided film thereof, and a conductive oxide.

Figure 3C:
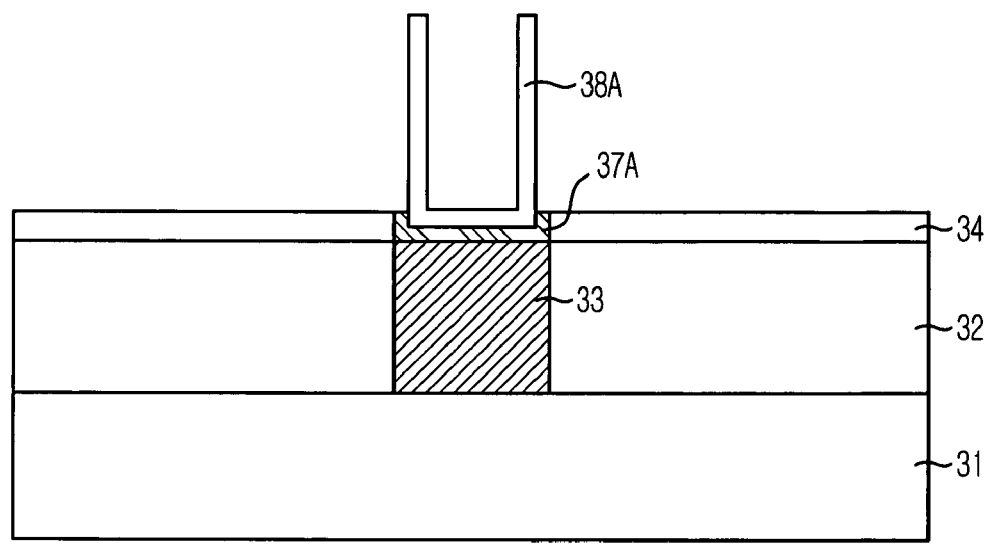

Referring to FIG. 3C, a storage node isolation process is performed to remove portions of the conductive layer 38 outside the storage node hole 36. As a result, a portion of the conductive layer 38, which has a cylinder-type structure and is referred to as remaining conductive layer 38A, remains only inside the storage node hole 36.

The storage node isolation process may comprise a chemical mechanical polishing (CMP) process or an etch-back process, thereby forming a cylinder-type storage node. During the CMP process or the etch-back process, the inside of the storage node hole 36 may be filled with a photoresist layer with a good step coverage property before the etch-back process is performed. By the etch-back process, the storage node oxide layer 35 is exposed. The photoresist layer is removed by ashing.

The storage node oxide layer 35 is removed by a full dip-out process, thereby exposing an inner wall and an external wall of the remaining conductive layer 38A. During the full dip-out process, the storage node oxide layer 35 may be etched by an HF solution. The catalytic layer 37 is simultaneously etched. As a result, a patterned catalytic layer 37A remains beneath the remaining conductive layer 38A. The etch stop layer 34 beneath the storage node oxide layer 35 comprises silicon nitride, which has a lower etch rate than the storage node oxide layer 35. Therefore, the full dip-out process effectively stops at the etch stop layer 34.

Figure 3D:
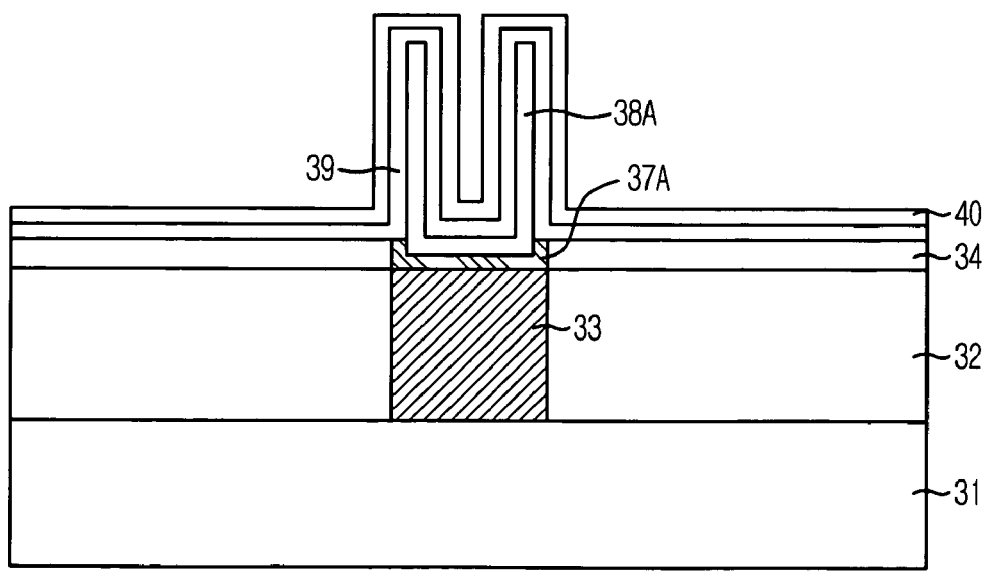

Referring to FIG. 3D, a dielectric layer 39 and a plate electrode 40 are sequentially formed over the remaining conductive layer 38A. The dielectric layer 39 includes a material selected from the group consisting of $HfO_2$, $Al_2O_3$, $ZrO_2$, $La_2O_3$, $Ta_2O_5$, $TiO_2$, BST($BaSrTiO_3$), $SrTiO_3$, PZT, BLT, SPT, $Bi_2Ti_2O_7$, and a combination thereof. Exemplary combinations of the above mentioned materials for the dielectric layer 39 are $HfO_2/Al_2O_3$ and $HfO_2/Al_2O_3/HfO_2$. In addition, the dielectric layer 39 may comprise a mixed layer, e.g., $Hf_xAl_yO_z$ including Hf and Al. The mixed layer may be formed through a method selected from a group consisting of a sputtering method, a CVD method, and an ALD method. In case that a multi-layered dielectric structure is formed as the dielectric layer 39 by the ALD method, a unit cycle of the ALD cycle may comprise providing sources in a sequence of [($Hf/N_2/O_3/N_2$)m($Al/N_2/O_3/N_2$)n]. Herein, m and n are less than approximately 10. When a PECVD method is performed to form the dielectric layer 39, oxygen source may be provided in the form of a plasma of $O_2$, in contrast with supplying $O_3$ in the aforementioned ALD unit cycle.

After the dielectric layer 39 is deposited, a post-treatment is performed by using $O_2$, $O_3$, or $O_2$ plasma at a temperature ranging from approximately 200° C. to approximately 500° C.

A silicon layer doped with a material such as arsenic (As) or phosphorus (P) or a titanium layer may be formed over the dielectric layer 39 as the plate electrode 40.

FIGS. 4A to 4D are cross-sectional views illustrating a method for fabricating a capacitor consistent with a third embodiment of the present invention.

Figure 4A:
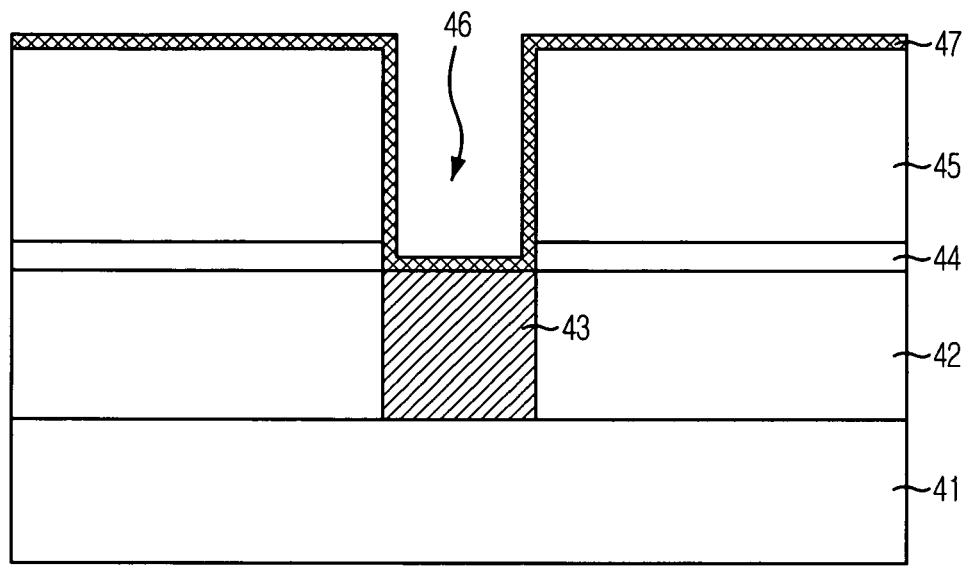
FIGS. 4A to 4D are cross-sectional views illustrating a method for fabricating a capacitor consistent with a third embodiment of the present invention.

Referring to FIG. 4A, an inter-layer insulation layer 42 is formed over a substrate 41 and then, a storage node contact plug 43 is formed in the inter-layer insulation layer 42 and is in contact with a predetermined portion of the substrate 41. Although not illustrated, device isolation, word lines, and bit lines of a DRAM may be formed before the formation of the storage node contact plug 43.

The storage node contact plug 43 comprises polysilicon or tungsten. When the storage node contact plug comprises polysilicon, the plug may be subjected to an etch-back process and recessed to a predetermined thickness and then, a titanium silicide layer for forming an ohmic contact can be formed.

An etch stop layer 44 and a storage node oxide layer 45 are deposited over an upper portion of the storage node contact plug 43. Herein, the storage node oxide layer 45 is an oxide layer to provide a hole in which a storage node with a cylinder-type structure will be formed, and the etch stop layer 44 is an etch barrier layer to prevent a lower structure from being etched during etching the storage node oxide layer 45.

The storage node oxide layer 45 and the etch stop layer 44 are sequentially etched, thereby forming a storage node hole 46 exposing the upper portion of the storage node contact plug 43.

A storage node is then formed over an entire surface of the storage node oxide layer 45 including the storage node hole 46 through two steps.

In the first step, a catalytic gas is applied over the entire surface of the storage node oxide layer 45 including the storage node hole 46, and is adsorbed into a surface of the storage node oxide layer 45 to form a surface adsorption layer 47. The catalytic gas comprises one selected from a group consisting of $I_2$, methyl iodide($CH_3I$), and ethyl iodide ($C_2H_5I$).

The catalytic gas can be applied after a plasma pre-treatment to increase adsorption of the catalytic gas. The plasma pre-treatment is performed using a plasma power ranging from approximately 10 W to approximately 2,000 W. The plasma pre-treatment uses a gas selected from a group consisting of hydrogen ($H_2$), nitrogen ($N_2$), argon (Ar), helium (He), ammonium ($NH_3$), and a combination thereof. The plasma pre-treatment is performed for approximately one cycle to approximately hundred cycles.

The surface adsorption layer 47 formed using the catalytic gas allows for a minimized incubation time when a storage node layer is subsequently formed over the storage node oxide layer 45, because since a nucleus generation density of the storage node layer is high. Also, the storage node layer with a uniform thickness can be deposited on a bottom portion of the storage node hole 46, thereby preventing degradation in a step coverage property due to an incubation time or a reduction in throughput. Furthermore, a deposition time of the storage node layer can be reduced as much as the number of cycles of the ALD is reduced.

Figure 4B:
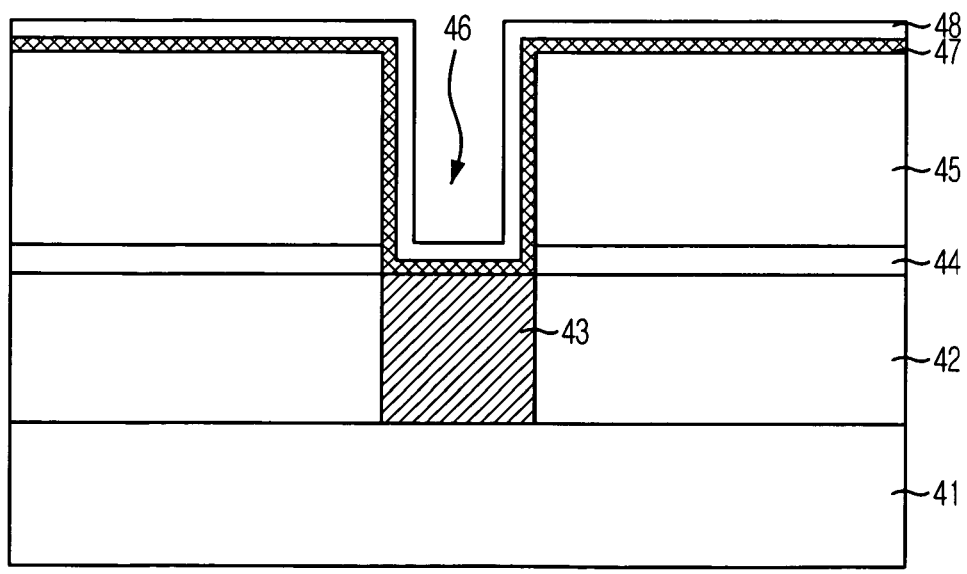

Referring to FIG. 4B, in the second step, a conductive layer 48 for a storage node is deposited by an ALD method or a combination of an ALD method and a CVD method. The conductive layer 48 comprises a material selected from a group consisting of Ru, Pt, Ir, Rh, Pd, Hf, Ti, W, Ta, a nitrided film thereof, and a conductive oxide layer.

In more detail, a unit cycle of the ALD method includes supplying a source gas, purging, supplying a reaction gas. The unit cycle is repeated for a number of times.

If a combination of the ALD method and the CVD method is performed, a source gas and a reaction gas are simultaneously supplied and thus, a CVD reaction takes place for a short time. Then, the purging is performed and afterwards, an annealing is performed, while the reaction gas is provided.

Additionally, a plasma treatment can be additional performed while the reaction gas is provided. The reaction gas provided during the plasma treatment may comprise a gas selected from the group consisting of oxygen ($O_2$), ammonia ($NH_3$), dyhydrogen oxide ($H_2O$), hydrazine ($N_2H_4$), $Me_2N_2H_2$, hydrogen ($H_2$), and a combination thereof. The plasma treatment is performed using a plasma power ranging from approximately 10 W to approximately 2,500 W at a temperature ranging from approximately 200° C. to approximately 500° C.

Furthermore, a cyclic CVD may be performed without purging. A CVD reaction may occur at the last stage of each cycle of the ALD method. Thus, a reduction in a period of the unit cycle and an improvement in a deposition rate of a thin film due to the CVD effect can be expected.

While the reaction gas is continuously supplied and the source gas is discontinuously supplied, the deposition takes place using the CVD method when the source gas is supplied.

In the above described method, when the reaction gas is supplied, plasma can be used. Compared to a typical ALD method or a typical plasma enhanced atomic layer deposition (PEALD) method, a period of the unit cycle is reduced and a CVD deposition periodically takes place, and thus, a fast deposition rate of the thin film can be obtained.

Because there is a step of removing a reaction material in the unit cycle, a property of the thin film is better as compared to a pure CVD thin film.

After the conductive layer 48 is deposited, a plasma treatment can be additionally performed in every unit cycle to improve a property of the thin film as the plasma treatment is performed after performing the ALD method.

Consistent with the third embodiment of the present invention, the conductive layer 48 may have a thickness ranging from approximately 100 Å to approximately 200 Å.

Figure 4C:
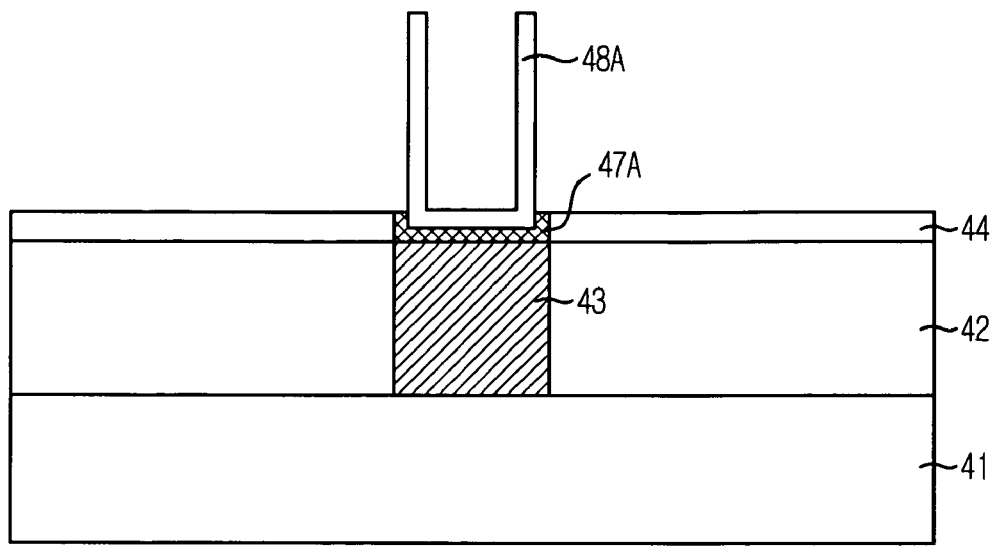

Referring to FIG. 4C, a storage node isolation process is performed to remove portions of the conductive layer 48 outside the storage node hole 46. As a result, a portion of the conductive layer, which has a cylinder-type structure and is referred to as remaining conductive layer 48A, remains only inside the storage node hole 46.

The storage node isolation process may comprise a chemical mechanical polishing (CMP) process or an etch-back process, thereby forming a cylinder-type storage node. During the CMP process or the etch-back process, the inside of the storage node hole 46 is filled with a photoresist layer with a good step coverage property before the etch-back process is performed. By the etch-back process, the storage node oxide layer 45 is exposed. The photoresist layer is then removed by ashing.

The storage node oxide layer 45 is removed by a full dip-out process, thereby exposing an inner wall and an external wall of the remaining conductive layer 48A. During the full dip-out process, the storage node oxide layer 45 may be etched by an HF solution. The surface absorption layer 47 may also be etched by the HF solution simultaneously. A patterned surface adsorption layer 47A remains beneath the remaining conductive layer 48. Because the etch stop layer 44 beneath the storage node oxide layer 45 comprises silicon nitride, which has a lower etch rate than the storage node oxide layer 45, the full dip-out process effectively stops at the etch stop layer 44.

Figure 4D:
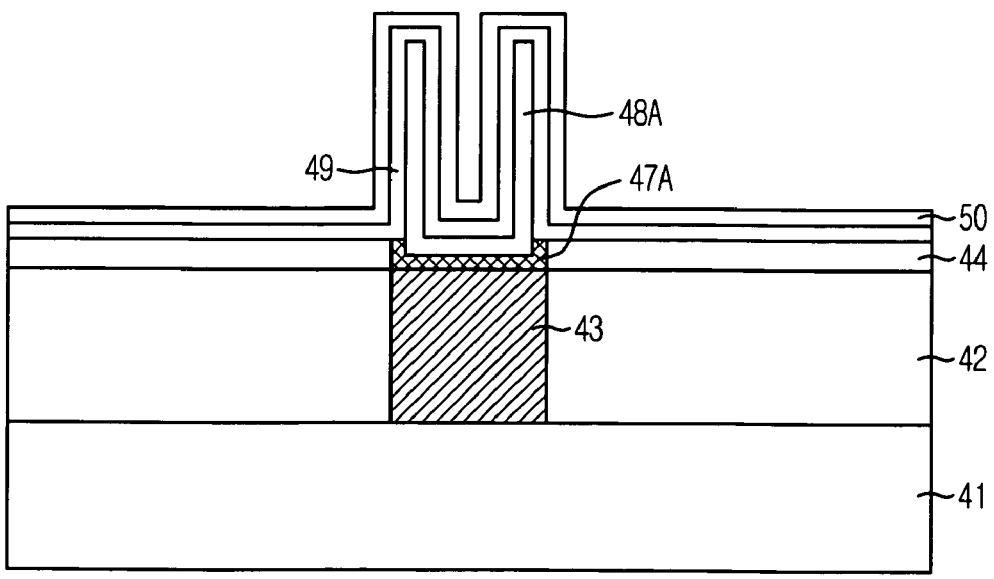

Referring to FIG. 4D, a dielectric layer 49 and a plate electrode 50 are sequentially formed over the remaining conductive layer 48A. The dielectric layer 49 includes a material selected from the group consisting of $HfO_2$, $Al_2O_3$, $ZrO_2$, $La_2O_3$, $Ta_2O_5$, $TiO_2$, BST($BaSrTiO_3$), $SrTiO_3$, PZT, BLT, SPT, $Bi_2Ti_2O_7$, and a combination thereof. Exemplary combinations of the above mentioned materials for the dielectric layer 49 are $HfO_2/Al_2O_3$ and $HfO_2/Al_2O_3/HfO_2$. In addition, the dielectric layer 49 may comprise a mixed layer, e.g., $Hf_xAl_yO_z$. The mixed layer may be formed through a method selected from a group consisting of a sputtering method, a CVD method, and an ALD method. In case that a multi-layered dielectric structure is formed as the dielectric layer 49 by the ALD method, a unit cycle of the ALD method may comprise providing sources in a sequence of $[(Hf/N_2/O_3/N_2) m(Al/N_2/O_3/N_2)n]$. Herein, m and n are less than approximately 10. When a PECVD method is performed to form the dielectric layer 49, oxygen source may be provided in the form of a plasma of $O_2$, in contrast with supplying $O_3$ in the aforementioned ALD cycle.

After the dielectric layer 49 is deposited, a post-treatment is performed by using $O_2$, $O_3$, and $O_2$ plasma at a temperature ranging from approximately 200° C. to approximately 500° C.

A silicon layer doped with a material such as arsenic (As) or phosphorus (P) or a titanium layer may be formed over the dielectric layer 49 as a plate electrode 50.

As described above, to increase a deposition property of a storage node and to decrease an incubation time, a low temperature ALD method, a catalytic layer deposition process, and a surface treatment using a catalytic gas are performed before the deposition of the storage node. Thus, a step coverage property is improved and an incubation time is reduced, thereby decreasing a process time.

Consistent with the present invention, a storage electrode of a DRAM capacitor can be fabricated. Also, an electrode of a ferroelectric capacitor including a gate electrode, a copper barrier, and iron of a ferroelectric random access memory (FeRAM) having a high density and adopting a three dimensional structure can be fabricated by using a method consistent with the present invention.

Consistent with the present invention, during fabricating a capacitor of a DRAM device having a design rule with a smallest feature size equal to or less than approximately 60 nm, it is possible to not only secure a step coverage property of a metal storage node deposition process but also to improve a throughput.

Furthermore, consistent with the present invention, during fabricating a capacitor of a FeRAM device having a design rule with a smallest feature size equal to or less than approximately 150 nm, it is possible to fabricate a FeRAM device having a good fatigue property and a ferroelectric property as a storage node fabrication process.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a capacitor, comprising:
   forming a storage node contact plug over a substrate;
   forming an insulation layer having an opening exposing a surface of the storage node contact plug over the storage node contact plug;
   forming a conductive layer including a lower layer and an upper layer over the insulation layer, side walls of the opening, and the exposed surface of the storage node contact plug, wherein forming the conductive layer comprises:
   forming the lower layer by performing a low temperature atomic layer deposition (ALD) process, and
   forming the upper layer on the lower layer by performing a high temperature process;
   performing an isolation process to isolate the conductive layer for the storage node; and
   sequentially forming a dielectric layer and a plate electrode over the isolated conductive layer for the storage node,
   wherein the low temperature ALD process is performed at a temperature ranging from approximately 100° C. to approximately 250° C., and the high temperature process is performed at a temperature of approximately 300° C. and
   wherein performing the high temperature process comprises using one of an ALD method and a combination of an ALD method and a chemical vapor deposition (CVD) method.

2. The method of claim 1, after the performing of the isolation process, further comprising removing the insulation layer through a dip-out process.

3. The method of claim 1, further comprising performing a plasma treatment when a reaction gas is flowed during one of the ALD method and the combination of the ALD method and the CVD method.

4. The method of claim 3, wherein the plasma treatment is performed using a gas selected from a group consisting of oxygen ($O_2$), ammonia ($NH_3$), dyhydrogen oxide ($H_2O$), hydrazine ($N_2H_4$), $Me_2N_2H_2$, hydrogen ($H_2$), and a combination thereof at a plasma power ranging from approximately 10 W to approximately 2,000 W, and a temperature ranging from approximately 200° C. to approximately 500° C.

5. The method of claim 1, wherein forming the conductive layer comprises forming a first portion of the conductive layer in a thickness ranging from approximately 10 Å to approximately 50 Å during the low temperature process, and forming a second portion of the conductive layer in a thickness ranging from approximately 50 Å to approximately 150 Å in the high temperature process.

6. The method of claim 1, wherein forming the conductive layer comprises performing one cycle to approximately one hundred cycles of the low temperature process.

7. The method of claim 1, wherein forming the conductive layer comprises forming a layer of a material selected from a group consisting of ruthenium (Ru), platinum (Pt), Iridium (Ir), rhodium (Rh), palladium (Pd), hafnium (Hf), titanium (Ti), tungsten (W), tantalum (Ta), a nitrided film, and a conductive oxide layer.

8. The method of claim 1, wherein forming the conductive layer comprises forming the storage node in a thickness ranging from approximately 100 Å to approximately 200 Å.

\* \* \* \* \*